(12) United States Patent
Aoki et al.

(10) Patent No.: US 6,238,932 B1
(45) Date of Patent: May 29, 2001

(54) METHOD FOR FABRICATING RELIABLE MULTILAYER BOTTOM ELECTRODE FOR FERROELECTRIC CAPACITORS

(75) Inventors: Katsuhiro Aoki, Tsuchiura; Tomoyuki Sakoda, Ibaraki; Yukio Fukuda, Tokai-mura, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/231,023

(22) Filed: Jan. 14, 1999

(51) Int. Cl.[7] .................................................... H01E 7/06
(52) U.S. Cl. ............................................ 438/3; 438/240
(58) Field of Search ........................................ 438/3, 240

(56) References Cited

U.S. PATENT DOCUMENTS

| | | | |
|---|---|---|---|
| 5,418,388 | * 5/1995 | Okudaira et al. | 257/295 |
| 5,874,364 | * 2/1999 | Nakabayashi et al. | 438/738 |
| 6,054,331 | * 4/2000 | Woo et al. | 438/3 |

* cited by examiner

*Primary Examiner*—Jey Tsai
(74) *Attorney, Agent, or Firm*—Carlton H. Hoel; W. James Brady; Frederick J. Telecky, Jr.

(57) ABSTRACT

A ferroelectric capacitor electrode contact structure comprising an insulator (4) placed over a substrate (2) and containing a transistor source (6) and transistor drain (8) between the substrate (2) and the insulator (4). The insulator (4) contains a source plug (10) and a conductive drain plug (12). The transistor source (6) is electrically connected to the source plug (10). The transistor drain (8) is electrically connected to the conductive drain plug (12). A transistor gate (14) is between the source plug (10) and a conductive drain plug (12) and is contained by the insulator (4). Metal wiring (16) is electrically connected to the source plug (10). A barrier film (18) is placed over the insulator (4) and the conductive drain plug (12). The bottom electrode (20) is placed over the barrier film (18). The ferroelectric layer (22) is placed over the bottom electrode (20). The top electrode (24) is placed over the ferroelectric layer (22).

2 Claims, 5 Drawing Sheets

$Pr = 13 \mu c/cm^2$    $E_c = 30 kV/cm^2$

METHOD FOR FABRICATING RELIABLE MULTILAYER BOTTOM ELECTRODE FOR FERROELECTRIC CAPACITORS

TECHNICAL FIELD OF THE INVENTION

This invention relates, in general, to a method for preventing oxidation of a bottom electrode in a ferroelectric capacitor. More specifically, this invention relates to a process for forming a ferroelectric capacitor wherein a metal is deposited at a high temperature or annealed at a high temperature prior to deposition of a ferroelectric (e.g. PZT) layer.

BACKGROUND OF THE INVENTION

Without limiting the scope of the invention, its background is described in connection with use of an oxidation barrier in a capacitor having a ferroelectric dielectric such as lead zirconium titanate (PZT) or bismuth strontium titanate.

Many semiconductor makers are making efforts to develop ferroelectric non-volatile memory (FeRAM) because it has potential to replace current memory types (DRAM, SRAM, EEPROM, etc.) Ferroelectric memory also has many applications in digital signal processors and smart cards.

SUMMARY OF THE INVENTION

To achieve a high integration density of ferroelectric memory cells, the cell structure in FIG. 1 has been proposed. Unfortunately, we have found that it has been difficult to form reliable ferroelectric capacitors because the ferroelectric dielectric needs to be formed in a highly-oxidizing atmosphere, but this causes oxidation of conductors below the capacitor by oxygen penetrating the bottom electrode metal layer.

The present invention involves a technique to prevent a barrier film from oxidizing which allows for the formation of a reliable ferroelectric (e.g. PZT) capacitor.

One use of this invention can be to provide a method for producing a ferroelectric capacitor with minimal oxidation occurring to conducting layers below the ferroelectric layer. This reduced oxidation will, e.g. reduce peeling of the bottom electrode.

The invention can involve a process for fabrication of a bottom electrode for a ferroelectric semiconductor, comprising the steps of depositing a bottom electrode over a conductive plug in an inert atmosphere at a temperature between 300 and 800 C, depositing a ferroelectric capacitor dielectric over the bottom electrode, and depositing a top electrode over the ferroelectric capacitor dielectric.

More specifically, one embodied process for fabrication of a bottom electrode for a ferroelectric semiconductor comprises the steps of depositing a titanium nitride layer over a conductive plug, the titanium nitride layer having a thickness between 10 and 100 nm, depositing a bottom electrode selected from the group consisting of iridium, platinum, ruthenium, and palladium over the titanium nitride layer in a vacuum at a temperature of about 500 C, the bottom electrode having a thickness of between 50 and 400 nm, depositing a ferroelectric capacitor dielectric over the metal, and depositing a top electrode over the ferroelectric capacitor dielectric.

BRIEF DESCRIPTION OF THE DRAWINGS

For a complete understanding of the present invention, including its features and advantages, reference is now made to the detailed description of the invention taken in conjunction with the accompanying drawings in which like numerals identify like parts and in which:

FIG. 4A represents deposition of iridium at room temperature; FIG. 4B represents deposition of iridium at high temperature;

DETAILED DESCRIPTION OF THE INVENTION

Figure 1:
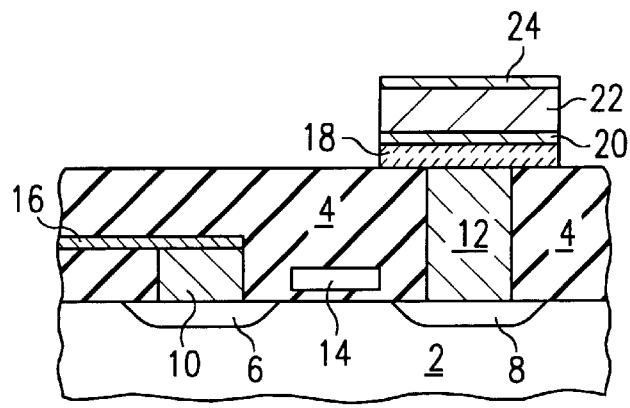
FIG. 1 is a cross-sectional view of a ferroelectric (PZT) capacitor.

FIG. 1 shows a cross-section of a ferroelectric capacitor. Insulator 4 is placed over substrate 2. A transistor source 6 and transistor drain 8 are in substrate 2. Insulator 4 contains source plug 10 and conductive drain plug 12. Transistor source 6 is electrically connected to source plug 10. Transistor drain 8 is electrically connected to conductive drain plug 12. Transistor gate 14 is also contained by insulator 4. Metal wiring 16 is electrically connected to source plug 10. Barrier film 18 is placed over insulator 4 and conductive drain plug 12. Bottom electrode 20 is placed over barrier film 18. Ferroelectric layer 22 is placed over bottom electrode 20. Top electrode 24 is placed over ferroelectric layer 22.

FIG. 2 shows cross-sectional representations of one method of forming a ferroelectric capacitor using the invented process.

Figure 2A:
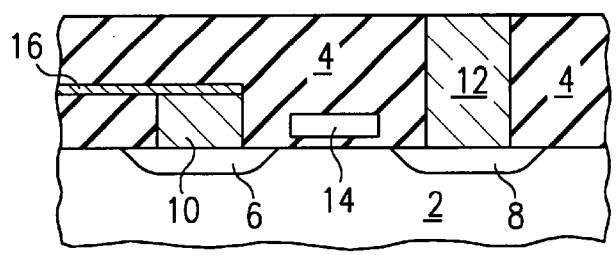
FIG. 2A–2F represents one method for the formation of a ferroelectric capacitor, with FIG. 2A showing a cross-sectional view of a basic substrate/oxide structure, FIG. 2B showing the addition of a barrier film to the structure of FIG. 2A, FIG. 2C showing the addition of a bottom electrode to the structure of FIG. 2B, FIG. 2D showing the addition of a PZT layer to the structure of FIG. 2C, FIG. 2E showing the addition of a top electrode to the structure of FIG. 2D, and FIG. 2F showing the structure of FIG. 2E after etching.

FIG. 2A shows insulator 4 placed over substrate 2. Transistor source 6 and transistor drain 8 are between substrate 2 and insulator 4. Insulator 4 contains source plug 10 and conductive drain plug 12. Transistor source 6 is electrically connected to source plug 10. Transistor drain 8 is electrically connected to conductive drain plug 12. Transistor gate 14 is between source plug 10 and conductive drain plug 12 and is contained by insulator 4. Metal wiring 16 is electrically connected to source plug 10.

Figure 2B:
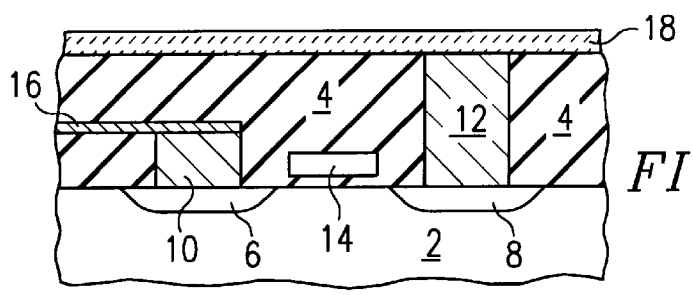

FIG. 2B shows barrier film 18 placed over insulator 4 and conductive drain plug 12.

Figure 2C:
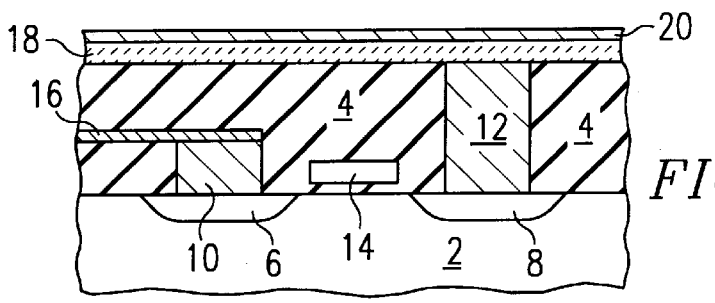

FIG. 2C shows bottom electrode 20 placed over barrier film 18.

Figure 2D:
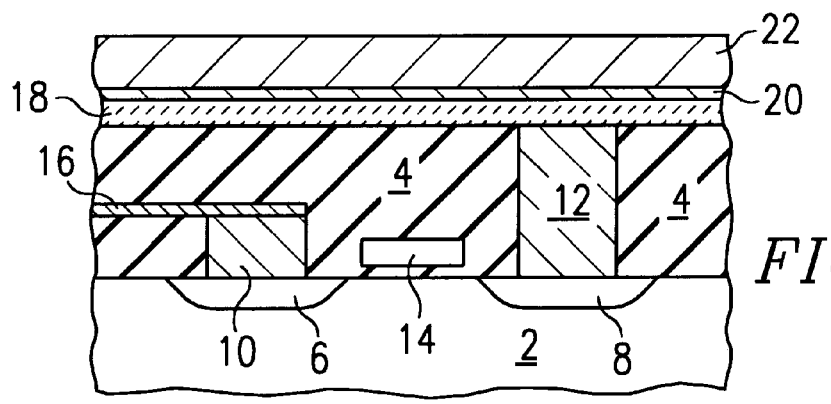

FIG. 2D shows ferroelectric layer 22 placed over bottom electrode 20.

Figure 2E:
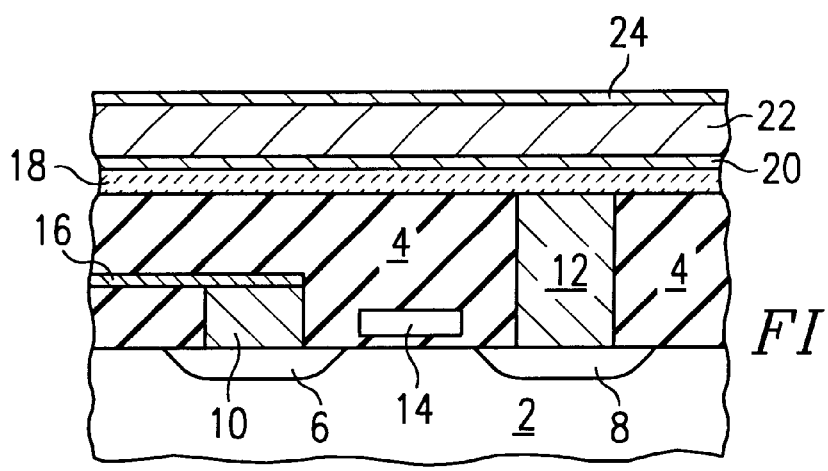

FIG. 2E shows top electrode 24 placed over ferroelectric layer 22.

Figure 2F:
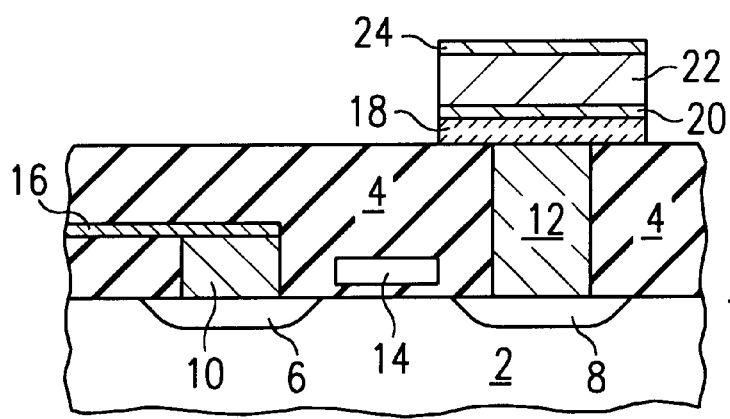

FIG. 2F shows the capacitor of FIG. 2E after etching.

Figure 3:
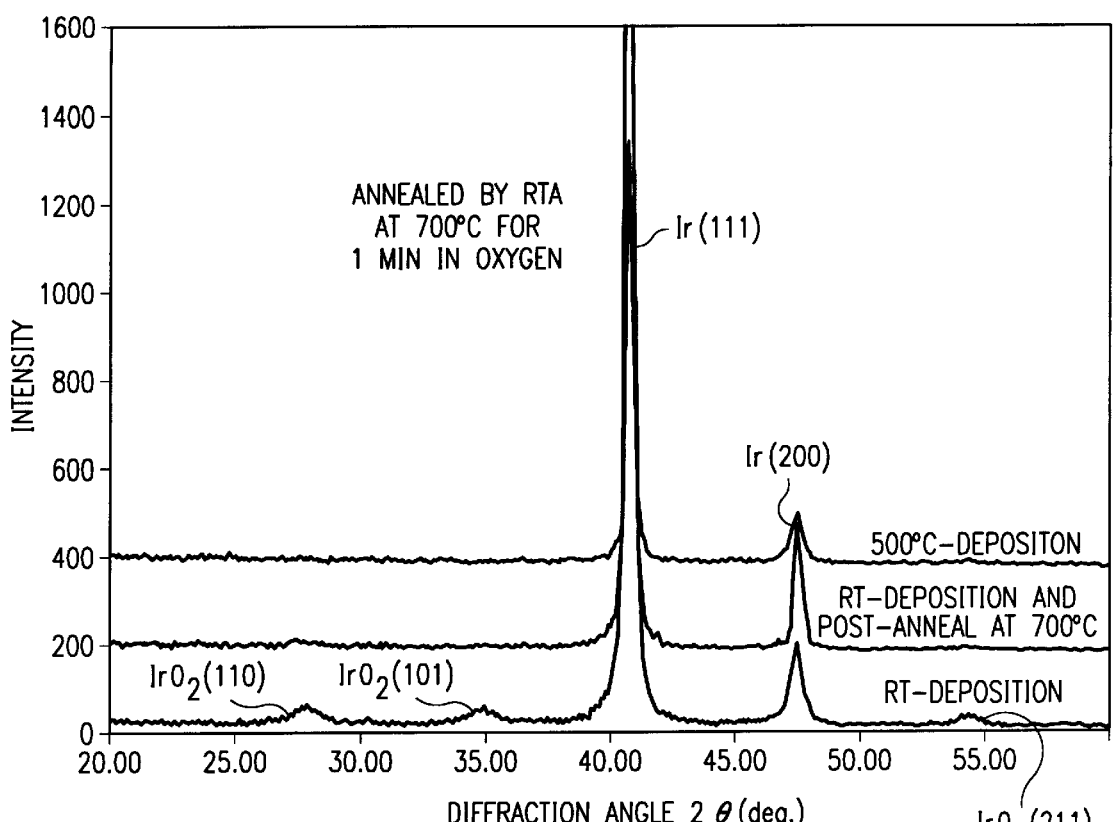
FIG. 3 is a X-ray diffraction pattern of annealed iridium deposited under various conditions.
Figure 4A:
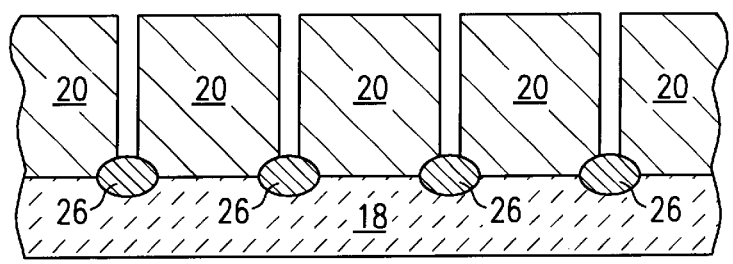
FIGS. 4A and 4B are simplified cross-sectional representations of iridium deposited onto a barrier film.
Figure 4B:
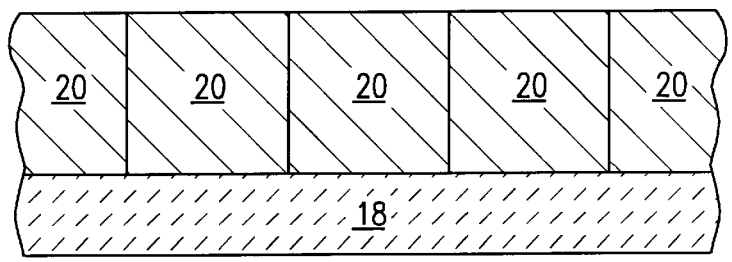
Figure 5A:
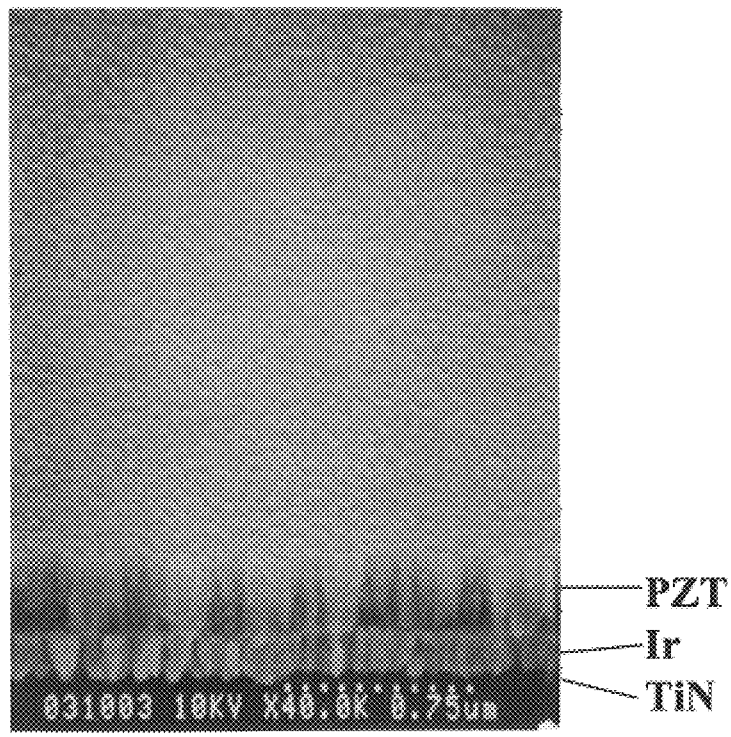
FIG. 5A is a cross-sectional SEM image of a PZT/IR/TiN/SiO$_2$ structure.
Figure 5B:
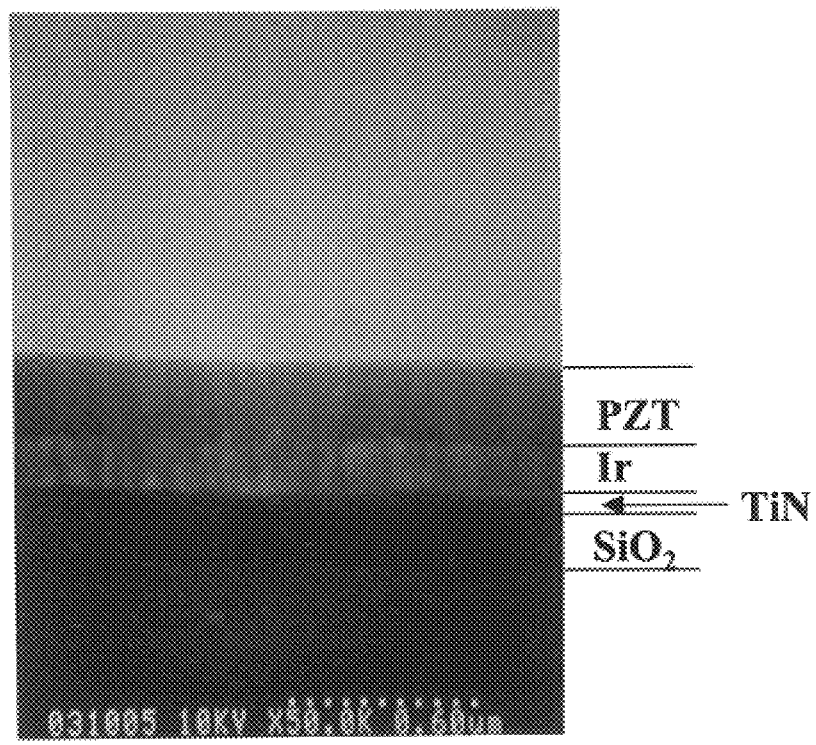
FIG. 5B is an SEM image of a PZT surface (300 nm thick) formed by sol-gel technique at 650 C over 10 minutes in the presence of oxygen.
Figure 6:
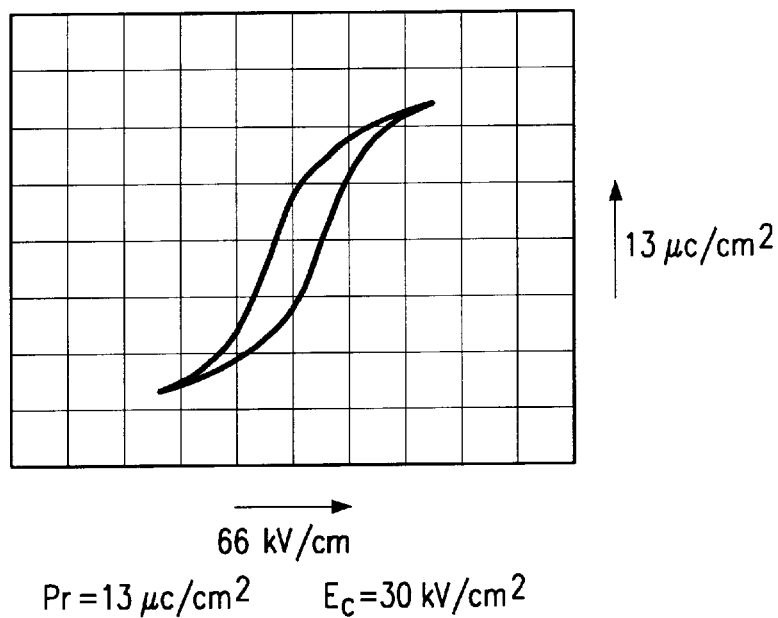
FIG. 6 is a hysteresis loop of a PZT capacitor having an Ir/PZT/IR/TiN/SiO$_2$ structure with an area of $7.5 \times 10^{-4}$ cm$^2$.
Figure 7:
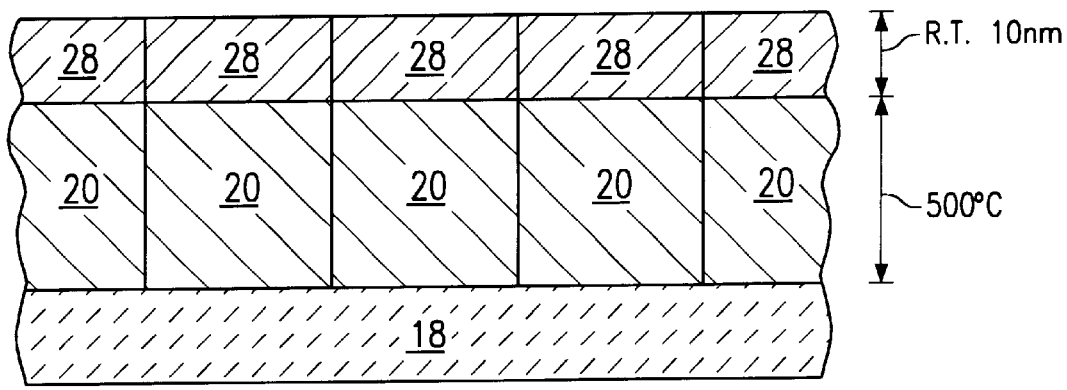
FIG. 7 is a cross-sectional view of a titanium nitride/iridium interface formed by varying the deposition temperature.

FIG. 3 shows the X-ray diffraction patterns of (A) iridium deposited at room temperature, (B) iridium deposited at room temperature, but annealed for 30 minutes at 700 C after deposition, and (C) iridium deposited at 500 C. Finally all three were annealed by RTA at 700 C for 1 minute. The diffraction peaks of $IrO_2$ are clearly observed from the iridium deposited at room temperature. On the other hand, the peaks of $IrO_2$ are not observed from the iridium films formed under conditions (B) and (C). These observations indicate that the oxidation properties of iridium films change markedly by postannealing or high temperature deposition. Oxidation of metals is believed to start at the point of defects or dislocations. Postannealing and high temperature deposition is believed to reduce the densities of those defects.

Plugs 12 and 14 may be made from a variety of materials, some examples of which are polysilicon and tungsten.

It a purpose of this invention to apply the bottom electrode 26 on barrier film 24 at a high temperature. This method prevents oxidation of conductors below the bottom electrode (e.g. the surface barrier film 24) that can cause, e.g., bottom electrode 26 to peel off during the PZT deposition process.

Plugs 12 and 14 may be made from a variety of materials, some examples of which are polysilicon and tungsten.

Barrier film 24 can comprise titanium, titanium silicide, titanium nitride, tantalum, molybdenum, tungsten, tantalum silicide, molybdenum silicide, tungsten silicide, and alloys and compounds thereof. Preferably, barrier film 24 comprises titanium nitride. Where the barrier film is titanium nitride, a titanium adhesion layer of less than 10 nm is formed between the titanium nitride and oxide layer 10. The thickness of barrier film 24 is preferably between 10 and 100 nm.

Bottom electrode 26 may be deposited by e-beam evaporation in a vacuum. Bottom electrode 26 preferably comprises iridium. Furthermore, the thickness of barrier film 26 is preferably between 50 and 400 nm. A key part of the invented process is that bottom electrode 26 is formed (deposited or annealed prior to the exposure to the highly-oxidizing dielectric formation process) at a high temperature. The deposition temperature is preferably between 350 and 700 C. Optimally, the deposition temperature is about 500 C.

EXAMPLE 1

An iridium film was deposited onto the base structure shown in FIG. 2A at room temperature by e-beam evaporation.

EXAMPLE 2

An iridium film was deposited onto the base structure shown in FIG. 2A at by e-beam evaporation. The structure was then annealed at 700 C for 30 minutes in a vacuum.

EXAMPLE 3

An iridium film was deposited onto the base structure shown in FIG. 2A at 500 C by e-beam evaporation.

EXAMPLE 4

A titanium nitride layer of 50 nm was deposited onto the structure shown in FIG. 2A. The conductive plugs shown in FIG. 2A may be either tungsten or polysilicon. A titanium adhesion layer of less than 10 nm is formed between the titanium nitride and the wafer. An iridium layer with a thickness of 200 nm was formed at 500 C by e-beam evaporation in a vacuum. It is possible to put a titanium adhesion layer having a thickness of less than 10 nm between the titanium nitride and the iridium. A PZT layer with a thickness of 300 nm is formed on the iridium layer by sol-gel deposition at 650 C for 10 minutes. A top iridium electrode layer with a thickness of 50 nm is deposited by e-beam evaporation. Finally, the Ir/PZT/Ir/TiN multilayer is patterned by electron cyclotron resonance (ECR) etching.

EXAMPLE 5

200-nm iridium films were deposited by e-beam evaporation on reactive-sputtering-deposited titanium nitride films having a thickness of 50 nm. The deposition temperatures of the iridium films were at room temperature. When a sol-gel PZT thin film was deposited on the Ir/TiN substrate at 650 C for 10 minutes in an oxygen environment, the PZT/Ir layer peeled off from the titanium nitride layer because of titanium nitride oxidation.

EXAMPLE 6

200-nm iridium films were deposited by e-beam evaporation on reactive-sputtering-deposited titanium nitride films having a thickness of 50 nm. The deposition temperatures of the iridium films were at 500 C. When a sol-gel PZT thin film was deposited on the Ir/TiN substrate at 650 C for 10 minutes in an oxygen environment, an excellent PZT/Ir/TiN structure was successfully formed. These results show that high-temperature deposition improves not only the oxidation property of iridium, but also the barrier effect against oxygen penetration. Tight grain boundaries are believed to be formed at high temperatures.

While the making and using of various embodiments of the present invention are discussed in detail above, it should be appreciated that the present invention provides many applicable inventive concepts which can be embodied in a wide variety of specific contexts. The specific embodiments discussed herein are merely illustrative of specific ways to make and use the invention, and do not delimit the scope of the invention.

What is claimed is:

1. A process for fabrication of a ferroelectric capacitor, comprising the steps of:

depositing a barrier film over a conductive plug;

forming a bottom electrode over said barrier in a vacuum at a temperature between 350 and 700 C, said temperature changing as said bottom electrode is being deposited and is adjusted to room temperature for the final about 10 nm of deposition;

depositing a ferroelectric capacitor dielectric over said bottom electrode; and depositing a top electrode over said ferroelectric capacitor dielectric.

2. A process for fabrication of a bottom electrode for a ferroelectric capacitor, comprising the steps of:

depositing a barrier film over a conductive plug;

forming a bottom electrode over said barrier wherein said forming is by depositing and the deposition of said bottom electrode starts at about 500 C and then is adjusted to room temperature for the final about 10 nm of deposition.

* * * * *

UNITED STATES PATENT AND TRADEMARK OFFICE
CERTIFICATE OF CORRECTION

PATENT NO.     : 6,238,932 B1                                              Page 1 of 1
DATED          : May 29, 2001
INVENTOR(S)    : Katsuhiro Aoki, Tomoyuki Sakoda and Yukio Fukuda It is certified that error appears in the above-identified patent and that said Letters Patent is hereby corrected as shown below:

<u>Title page,</u>
Please add the following as Item [60]:
-- This application claims priority under 35 USC §119(e)(1) of provisional application number 60/072,478 filed 01/14/98. --

Signed and Sealed this

Eighteenth Day of November, 2003

JAMES E. ROGAN
*Director of the United States Patent and Trademark Office*